United States Patent [19]

Tsui

[11] Patent Number: 4,633,516
[45] Date of Patent: Dec. 30, 1986

[54] INSTANTANEOUS FREQUENCY MEASUREMENT RECEIVER WITH DIGITAL PROCESSING

[75] Inventor: James B. Y. Tsui, Centerville, Ohio

[73] Assignee: United States of America as represented by the Secretary of the Air Force, Washington, D.C.

[21] Appl. No.: 739,413

[22] Filed: May 30, 1985

[51] Int. Cl.$^4$ ............................................. H04B 17/00
[52] U.S. Cl. ................................. 455/226; 324/78 D; 364/484; 342/192
[58] Field of Search ...................... 455/226, 145, 146; 324/78 D; 343/5 SA, 18 E; 364/484

[56] References Cited

U.S. PATENT DOCUMENTS

| | | | |
|---|---|---|---|
| 3,181,156 | 4/1965 | Ward | 455/226 |
| 3,431,405 | 3/1969 | Dawson . | |
| 3,602,812 | 8/1971 | Paradise | 455/226 |
| 3,939,411 | 2/1976 | James | 324/77 H |
| 4,021,804 | 5/1977 | Dounce et al. | 343/17.1 R |
| 4,268,279 | 5/1981 | Hines | 364/726 |
| 4,336,541 | 6/1982 | Tsui et al. | 343/18 E |
| 4,364,048 | 12/1982 | Waters et al. | 343/5 EM |
| 4,426,648 | 1/1984 | Tsui et al. | 343/18 E |
| 4,547,727 | 10/1985 | Tsui et al. | 343/5 SA |

FOREIGN PATENT DOCUMENTS

| | | | |
|---|---|---|---|
| 0058050 | 8/1982 | European Pat. Off. | 364/484 |
| 0131781 | 10/1980 | Japan | 324/78 D |
| 0204464 | 12/1982 | Japan | 324/78 D |
| 0207869 | 12/1982 | Japan | 324/78 D |
| 0129368 | 8/1983 | Japan | 364/484 |

Primary Examiner—Marc E. Bookbinder
Attorney, Agent, or Firm—Bernard E. Franz; Donald J. Singer

[57] ABSTRACT

The receiver comprises a 90° hybrid and analog-to-digital converters between the RF section and digital processing; which makes it possible to eliminate a phase correlator, four diode detectors and two differential amplifiers used in previous IFM receivers to obtain the sine and cosine signal samples at an initial time and at a delayed time.

3 Claims, 3 Drawing Figures

IFM RECEIVER WITH TWO DIGITIZERS

IFM RECEIVER WITH FOUR DIGITIZERS

IFM RECEIVER WITH TWO DIGITIZERS

INSTANTANEOUS FREQUENCY MEASUREMENT RECEIVER WITH DIGITAL PROCESSING

RIGHTS OF THE GOVERNMENT

The invention described herein may be manufactured and used by or for the Government of the United States for all governmental purposes without the payment of any royalty.

BACKGROUND OF THE INVENTION

The present invention relates generally to the field of instantaneous frequency measurement (IFM) receivers with digital processing.

The conventional IFM receiver is a radio frequency receiver used primarily in electronic warfare. Its basic function is to measure the frequency of pulsed signals radiated from hostile radar. Generally, it may be said that IFM receivers measure the frequencies of incoming RF signals utilizing interferometric techniques by detecting the phase shift magnitudes produced in multiple, calibrated delay lines. For instance, the received RF signal is divided and simultaneously introduced into a non-delayed path and a delay line of known length. Since the phase differences between the delayed and non-delayed receiver paths are functions of the input signal frequency, conversion of the phase difference signals to video signals provides signals whose amplitudes are related to phase delay. These video signals typically take the form $\sin \omega \tau$ or $\cos \omega \tau$, where $\omega$ is the angular frequency of the processed input signal. The $\sin \omega \tau$ and $\cos \omega \tau$ signals are delivered to an encoding network which makes amplitude comparisons of the signals, determines the numerical value of $\omega$, and generates the digital frequency descriptive word.

An IFM receiver has many attractive features necessary for electronic warfare applications, such as small size, light weight, wide instantaneous bandwidth, and fine frequency resolution.

Typical IFM receivers are shown in U.S. Pat. Nos. 3,939,411 to James, and 4,336,541 and 4,426,648 to Tsui and Shaw. Other U.S. patents of interest are U.S. Pat. Nos. 4,021,804 to Dounce et al; 4,268,279 to Hines; 3,431,405 to Dawson; and 4,364,048 to Waters et al.

SUMMARY OF THE INVENTION

An object of the invention is to simplify the design of IFM receivers.

An IFM receiver according to the invention comprises a 90° hybrid and analog-to-digital converters between the RF section and digital processing; which makes it possible to eliminate a phase correlator, four diode detectors and two differential amplifiers used in previous IFM receivers.

DETAILED DESCRIPTION

Figure 1:
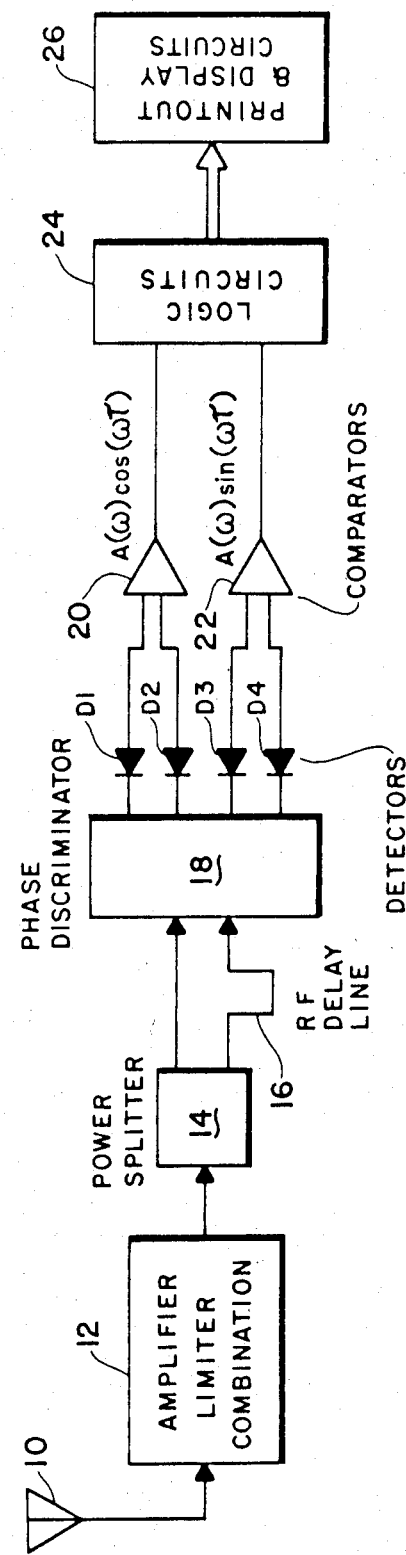
FIG. 1 is a diagram of a prior art IFM receiver.

Referring to FIG. 1, a typical conventional prior art IFM receiver consists of an RF section comprising an amplifier-limiter combination 12 with input from an antenna 10, a power splitter 14, an RF delay line 16, a phase correlator or phase discriminator 18, diode detectors D1–D4, differential amplifier comparators 20,22 and logic circuits 24. The frequency in digital format is supplied from the logic circuits 24 to utilization circuits 26. An input signal passing through the RF section is separated into two parts: one proceeds directly to the phase discriminator 18, the other passes through the delay line 16 before proceeding to the phase discriminator 18. At the outputs of the discriminator there are four diode detectors followed by comparators 20,22 and logic circuits 24 (which may include a memory).

The phase correlator 18 is used to provide the necessary phase shift to the input signals and combine the signals to certain desired forms at its four outputs, and each of them is followed by a diode detector. The diode detectors D1–D4 convert the RF signals into video signals and at the same time perform mathematical squaring to the input signals. The outputs of the detectors D1–D4 are connected to the inputs of two differential amplifiers 20 and 22. Each differential amplifier amplifies the difference of its two input signals. The outputs of the differential amplifiers are $\sin \omega \tau$ and $\cos \omega \tau$, where $\omega$ is the input angular frequency and $\tau$ is the delay time of the delay line 16. The logic circuits 24 following the differential amplifiers digitize the outputs and further process the data to generate the frequency information.

An IFM receiver according to the invention simplifies the design by eliminating the phase correlator, four diode detectors and two differential amplifiers of FIG. 1, and substitutes analog-to-digital converters followed by digital processing to perform the functions.

Figure 3:
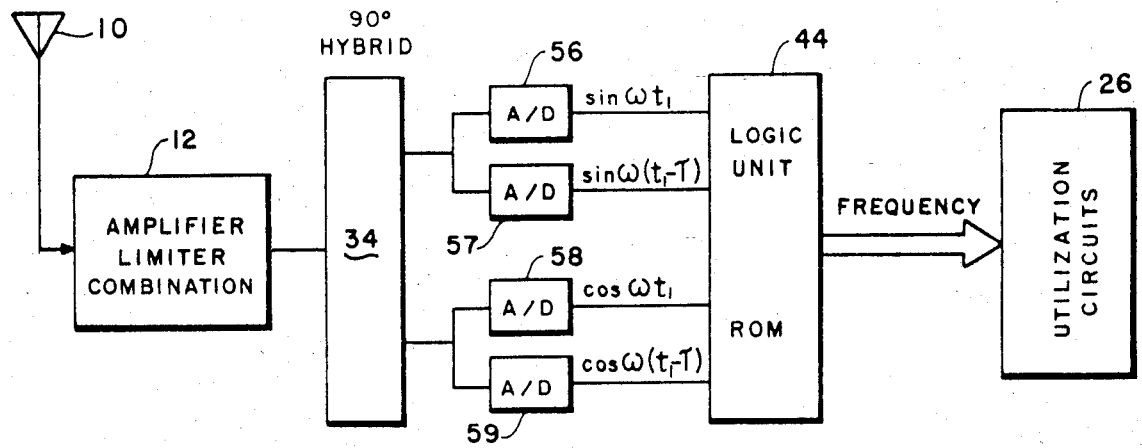
FIGS. 2 and 3 are diagrams of IFM receivers with A/D converters.
Figure 2:
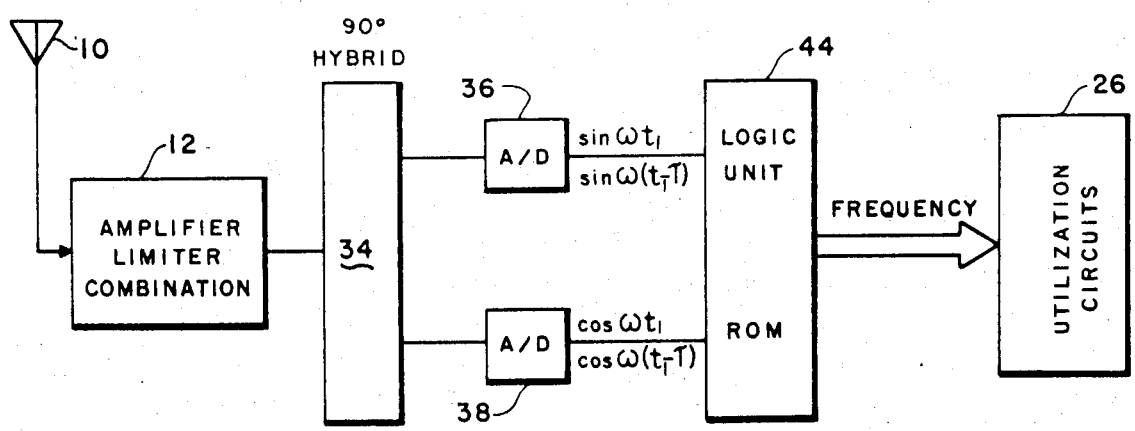

As shown in FIGS. 2 and 3, the IFM receiver has the same amplifier-limiter combination 12 as in FIG. 1, and has the output in the same digital format for supply to the utilization circuits 26. The circuit now includes a 90° hybrid, and analog-to-digital (A/D) converters. The input signal from the amplifier-limiter combination 12 passes through the 90° hybrid 34. The outputs are $\sin \omega \tau$ and $\cos \omega \tau$. FIG. 2 shows two A/D converters 36 and 38 to digitize these outputs at time $t_1$, and then at time $(t_1 + \tau)$. If the A/D converters are too slow to sample at time $\tau$ apart, then four A/D converters 56–59 can be used as shown in FIG. 3. In that case, two of the A/D converters 56 and 58 will sample at time $t_1$, and the other two 57 and 59 will sample at time $(t_1 + \tau)$. In both of FIGS. 2 and 3, there are four A/D converter outputs listed as:

$$A = \sin \omega t_1 \quad (1)$$

$$B = \cos \omega t_1 \quad (2)$$

$$C = \sin (\omega t_1 - \omega \tau) \quad (3)$$

$$D = \cos (\omega t_1 - \omega \tau) \quad (4)$$

The above four equations are combined as follows:

$$\begin{aligned} E &= -BC + AD \quad (5) \\ &= -\cos \omega t_1 \sin(\omega t_1 - \omega \tau) + \sin \omega t_1 \cos(\omega t_1 - \omega \tau) \\ &= \sin \omega \tau \end{aligned}$$

$$\begin{aligned} F &= BD + AC \quad (6) \\ &= \cos \omega t_1 \cos(\omega t_1 - \omega \tau) + \sin \omega t_1 \sin(\omega t_1 - \omega \tau) \\ &= \cos \omega \tau \end{aligned}$$

$$G = \tan^{-1}(E/F) \quad (7)$$

$$\omega = G/\tau \quad (8)$$

The mathematical operations for equations (5) to (8) can be performed by properly programmed read only memories (ROMs) in the logic unit 44. The frequency from the memory appears at the output of the logic unit 44 in digital format.

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

What is claimed is:

1. An instantaneous frequency measurement receiver comprising an RF section, a 90° hybrid coupled to the RF section to split the RF signal into signals on sine and cosine lines, converter means coupled to the sine and cosine lines to convert the analog signals on the sine and cosine lines into digital format, a logic unit coupled to outputs of the converter means, said logic unit having means for storing at a time $t_1$ the digital signals A and B, and for storing at a time $(t_1 + \tau)$ the digital signals C and D, where $$A = \sin \omega t_1$$

$$B = \cos \omega t_1$$

$$C = \sin (\omega t_1 - \omega \tau)$$

$$D = \cos (\omega t_1 - \omega \tau),$$

digital means in said logic unit to perform the operations $$E = -BC + AD$$

$$F = BD + AC$$

$$G = \tan^{-1} (E/F)$$

$$\omega = G/\tau$$

and to provide an output for frequency in digital format as a function of $\omega$.

2. The apparatus recited in claim 1, wherein said converter means comprises two analog-to-digital converters, which are a first converter with an input from the sine line and a second converter with an input from the cosine line, and wherein said connector means includes means to sample the outputs of said 90° hybrid and digitize said samples at time $t_1$ to obtain the signals A and B respectively, and at time $(t_1 + \tau)$ to obtain the signals C and D respectively.

3. The apparatus recited in claim 1, wherein said converter means comprises four analog-to-digital converters, which are a first and a second converter each having an input from the sine line, and a third and a fourth converter each having an input from the cosine line, and wherein said first and third converters respectively include means to sample the signals on the sine and cosine lines of said 90° hybrid and digitize such samples at time $t_1$ to obtain the signals A and B respectively, and said second and fourth converters respectively include means to sample the signals on the sine and cosine lines of said 90° hybrid and digitize such samples at time $(t_1 + \tau)$ to obtain the signals C and D respectively.

* * * * *

UNITED STATES PATENT AND TRADEMARK OFFICE
CERTIFICATE OF CORRECTION

PATENT NO.  : 4,633,516

DATED       : December 30, 1986

INVENTOR(S) : James B.Y. Tsui

It is certified that error appears in the above-identified patent and that said Letters Patent is hereby corrected as shown below:

Claim 2, line 5, "connector" should read ---converter---.

Signed and Sealed this

Twenty-first Day of April, 1987

Attest:

DONALD J. QUIGG

Attesting Officer

Commissioner of Patents and Trademarks